United States Patent
Lin et al.

[11] Patent Number: 6,153,478
[45] Date of Patent: Nov. 28, 2000

[54] STI PROCESS FOR ELIMINATING KINK EFFECT

[75] Inventors: Tony Lin, Kaohsiung; Wen-Kuan Yeh, Chu Pei; Heng-Sheng Huang, Taipei, all of Taiwan

[73] Assignee: United Microelectronics Corp., Hsinchu, Taiwan

[21] Appl. No.: 09/014,755

[22] Filed: Jan. 28, 1998

[51] Int. Cl.$^7$ ........................................... H01L 21/00
[52] U.S. Cl. ..................... 438/296; 438/424; 438/696; 438/697; 438/698; 438/701
[58] Field of Search .................... 438/296, 424, 438/691, 696, 697, 698, 701, 723, 724

[56] References Cited

U.S. PATENT DOCUMENTS

| | | |
|---|---|---|
| 5,308,785 | 5/1994 | Comfort et al. . |
| 5,387,540 | 2/1995 | Poon et al. . |
| 5,416,041 | 5/1995 | Schwalke . |
| 5,447,884 | 9/1995 | Fahey et al. ............... 437/67 |
| 5,700,712 | 12/1997 | Schwalke . |
| 5,786,263 | 7/1998 | Perera . |
| 5,801,083 | 9/1998 | Yu et al. .................. 438/424 |
| 5,869,384 | 2/1999 | Yu et al. . |
| 5,895,254 | 4/1999 | Huang et al. ............ 438/424 |
| 5,904,540 | 5/1999 | Sheng et al. ............. 438/427 |
| 5,918,131 | 6/1999 | Hsu et al. ................ 438/296 |
| 5,937,309 | 8/1999 | Chuang ................... 438/424 |

*Primary Examiner*—Gregory Mills
*Assistant Examiner*—George Goudreau
*Attorney, Agent, or Firm*—Merchant & Gould P.C.

[57] ABSTRACT

The process includes the following steps. At first, a masking layer is formed over the semiconductor substrate. A portion of the masking layer is then removed to form an opening to the semiconductor substrate. Sidewall spacers are formed on the opening and a portion of the semiconductor substrate is removed to form a trench, through an aperture defined by the sidewall spacers. The sidewall spacers is then removed and a liner layer is formed conformably over the trench.

20 Claims, 3 Drawing Sheets

STI PROCESS FOR ELIMINATING KINK EFFECT

FIELD OF THE INVENTION

The present invention relates to the semiconductor fabrication, and more specifically, to the process of forming a STI (shallow trench isolation) for eliminating the kink effect.

BACKGROUND OF THE INVENTION

With the progressing of the semiconductor integrated circuits to the ULSI (ultra large scale integration) level or even higher level, the integrity of the integrated circuits rises with an explosive rate. The capacity of a single semiconductor chip increases from several thousand devices to hundreds of million devices, or even billions of devices. Taking DRAM (dynamic random access memories) for example, the increasing integrity in manufacturing extends the capacity of a single chip to step from earlier 4 megabit to 16 megabit, and further to 256 megabit or even higher. The integrated circuits devices like transistors, capacitors, and connections must be greatly narrowed accompanying with the advancement. At the same time, the region for forming the isolations must be greatly reduced.

The increasing packing density of the integrated circuits generates numerous challenges to the formation of the isolation region in the semiconductor manufacturing process. The isolation region need to be formed within smaller area without influencing the isolating characteristics and the operations of the devices and the circuits. The present technology research focus mainly on fabricating highly reliable and densely arranged isolation region for the submicrometer or even smaller semiconductor devices.

The shallow trench isolation (STI) which forms isolations by etching and refilling trenches, is a widely employed technology for densely packed circuits. The STI replaces the conventional LOCOS (local oxidation of silicon) in several ULSI applications. The STI is used in the isolation of devices within the same tub, of bipolar devices, and of n-channel and p-channel devices. The STI is also employed in forming the trench-capacitors for DRAMs.

Unfortunately, the conventional STI has a serious problem of damaging the operations of the active devices with a reduced threshold voltage. A problem called kink effect arises from an anomalous channel current turn-on at subthreshold regime. The kink effect is caused by enhanced electrical field at the edge of the active region. It was found that the STI corner oxide recess is a major issue. Referring to FIG. 1, a cross sectional view of a conventional STI structure is shown. A trench isolation structure 10 is formed in a semiconductor substrate 12. A liner oxide layer 14 is formed conformably within the trench as an insulation layer. A filling layer 16 like a CVD (chemical vapor deposited) oxide layer is filled within the trench. A conductor layer 18, generally a row of polysilicon gate structure, is formed over the semiconductor substrate 12 and crossing over the trench isolation structure 10. A gate oxide layer 20 is insulated between the semiconductor substrate 12 and the conductor layer 18.

A recessed shape at the top of the CVD oxide 16 is formed during the planarization process in the formation of the trench structure 10. A portion of the trench structure 10, circled by the region 22, is enlarged in FIG. 2. A convex edge 12a is found in adjacent to the trench structure 10. The thickness of the liner oxide layer 14 is much thinner at the convex edge 12a because of the sharp angle and the reduced oxide growth rate under the crystalline orientation effect of the semiconductor substrate 12. Under the effect of the thinner oxide, the electric field at the convex edge 12a is much stronger then other portions of the semiconductor substrate 12. Thus the current of the device under operation is turned on with a lower voltage at the convex edge 12a. The channel turn-on at the subthreshold voltage is called the "kink effect". The kink effect reduces the threshold voltage and induces the current at undesired locations. The operation of the active devices are influenced. Furthermore, the recessed shape at the top of the CVD oxide 16 can enhance the problem. The electric field is enhanced at the convex edge 12a by the lower and closer location conductor layer 18 which formed over the recessed region. Thus the threshold voltage is further reduced.

To fabricate the future integrated circuits with high integration density of the devices, a solution to the kink effect is required. A trench isolation technology without reducing the threshold voltage and without damaging the operation of the devices is needed.

SUMMARY OF THE INVENTION

A process of forming a STI (shallow trench isolation) is provided in the present invention to eliminate the kink effect. A T-shaped trench can be formed with the method disclosed. A thicker liner layer is grown at a corner portion of the trench boundary. The problem of the enhanced electric field at the active edges of the semiconductor can be reduced. The threshold voltage of the active devices can be raised. The kink effect is eliminated for fabricating the integrated circuits with higher integration density. A thicker liner layer can be formed at the corner region of the trench under larger exposed area. A T-shape trench can be obtained simultaneously.

The method in the present invention for forming a trench isolation includes the following steps. At first, a masking layer is formed over the semiconductor substrate. A portion of the masking layer is then removed to form an opening to the semiconductor substrate. Sidewall spacers are formed on the opening and a portion of the semiconductor substrate is removed to form a trench, through an aperture defined by the sidewall spacers. The sidewall spacers is then removed and a liner layer is formed conformably over the trench. A thicker liner layer can be formed at the corner region of the trench under larger exposed area. A T-shape trench can be obtained simultaneously.

In addition, the method of the present invention can include two more steps. A filling layer is formed over the liner layer within the trench, and over the masking layer. The masking layer and a portion of the filling layer which locates outside the trench is then removed to have a trench structure. A thicker liner layer can be formed at the corner region of the trench under larger exposed area. A T-shape trench can be obtained simultaneously. The corner oxide recess in the conventional trench isolation is reduced and larger subthreshold Kink free device window can be obtained.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings.

DETAILED DESCRIPTION OF THE PREFERRED EMBODIMENT

A process of forming a STI (shallow trench isolation) for eliminating the kink effect is provided in the present invention. Via the formation and the removing of spacers on the opening which defines the trench region, a thicker liner layer at a concave edge can be grown. The kink effect coming from enhanced electric field at the concave edge can be eliminated.

Figure 1:
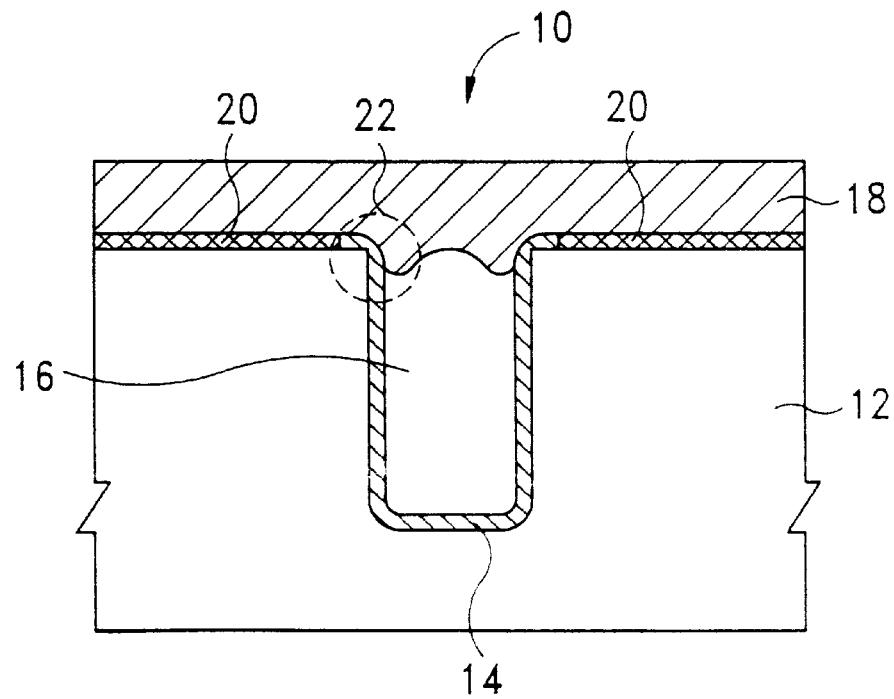
FIG. 1 illustrates a cross sectional view of a conventional trench isolation structure in the prior art.
Figure 2:
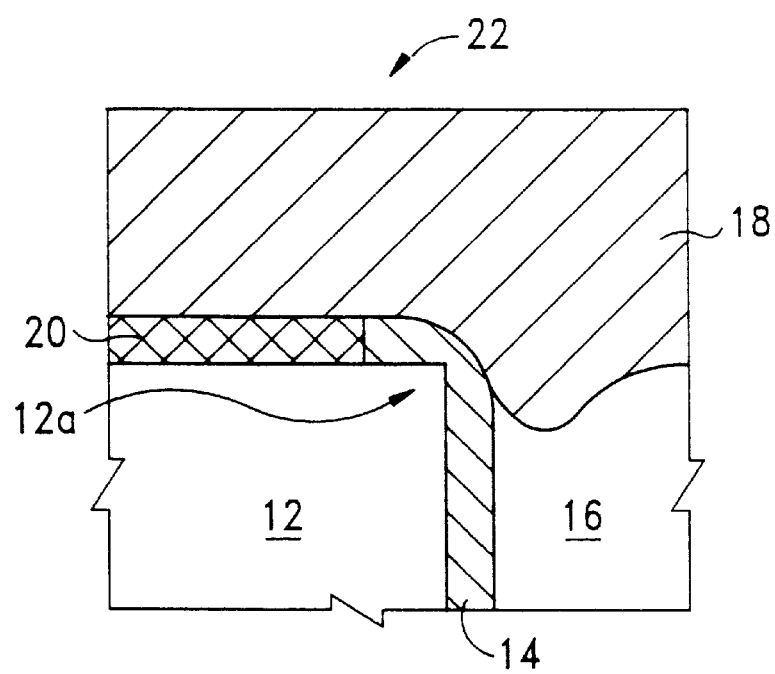
FIG. 2 shows a cross sectional view of an enlarged illustration of a portion of the conventional trench isolation structure in the prior art.
Figure 3:
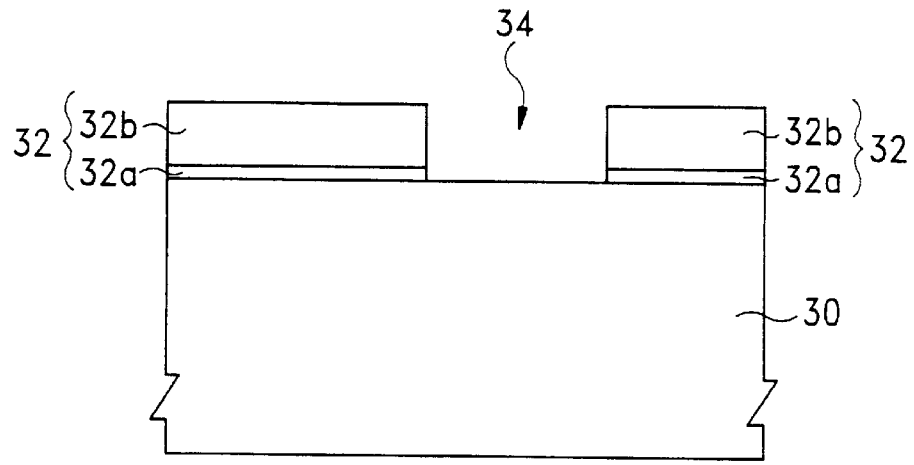
FIG. 3 illustrates a cross sectional view of the semiconductor substrate with the formation of a masking layer in the present invention.

Referring to FIG. 3, a semiconductor substrate 30 is provided. A semiconductor substrate 30 with a preferable single crystalline silicon in a <100> crystalline direction can be used. A masking layer 32 is formed over the semiconductor substrate 30. In general, the masking layer 32 can be a combination of a set of layers for defining the trench region. In a preferred embodiment, the masking layer 32 is composed of a pad oxide layer 32a and a nitride layer 32b. The pad oxide layer 32a is thermally grown from the semiconductor substrate 30 in an oxygen containing ambient. The nitride layer 32b can be formed over the pad oxide layer 32a through a chemical vapor deposition process, or more specifically a low pressure chemical vapor deposition process. A portion of the masking layer 30 is then removed to form an opening 34 to the semiconductor substrate 30. A well known patterning process including a lithography process and an etching process can be applied in forming the opening 34.

Figure 4:
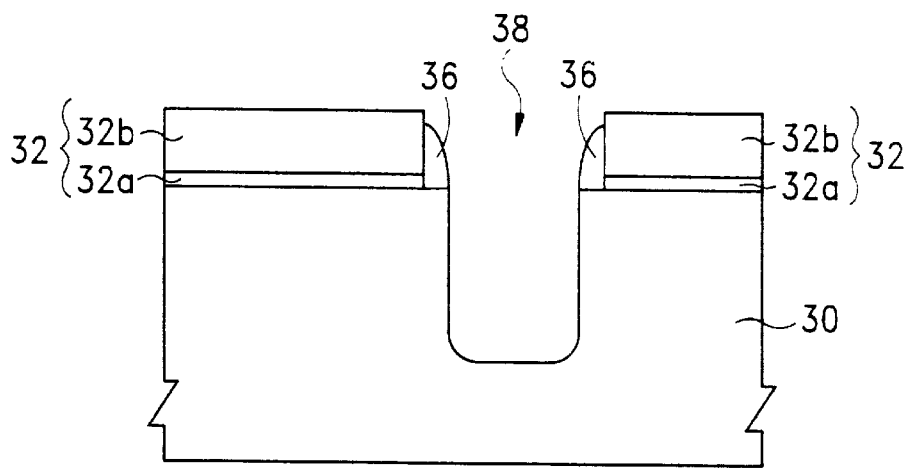
FIG. 4 illustrates a cross sectional view of forming sidewall spacers and a trench on the semiconductor substrate in the present invention.

Referring to FIG. 4, sidewall spacers 36 are then formed on the opening 34 around the sidewall portion. In the case, oxide spacers can be used as the sidewall spacers 36. The materials other than oxide can also be used in forming the sidewall spacers 36. In the case, the oxide spacers 36 are formed by a two step process. A CVD (chemical vapor deposited) oxide blanket is formed at first. An etching back step employing an anisotropic etching method is then utilized to form the oxide spacers 36. A portion of the semiconductor substrate 30 is then removed to form a trench 38. The removing is performed through an aperture defined by the oxide spacers 36, as shown in FIG. 4. A high selectivity (spacers/substrate) etching is adopted through the adjustment of the recipe. In most cases, the removing process to form the trench 38 is performed with a reactive ion etching (RIE) process to form a shallow trench with the anisotropic etching characteristics.

Figure 5:
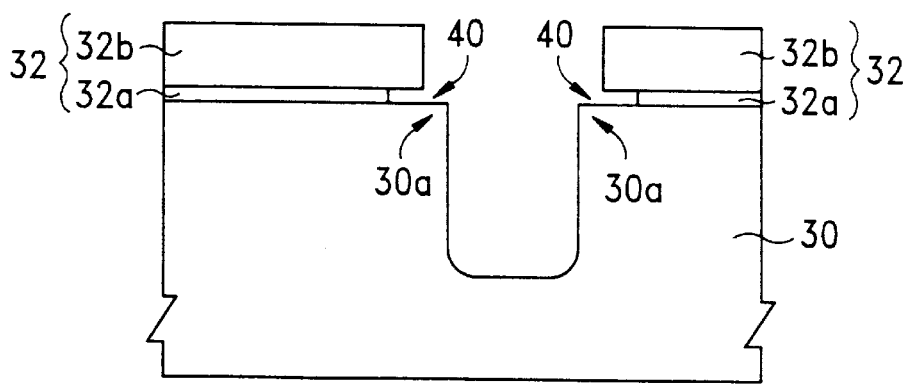
FIG. 5 illustrates a cross sectional view of removing the sidewall spacers in the present invention.
Figure 6:
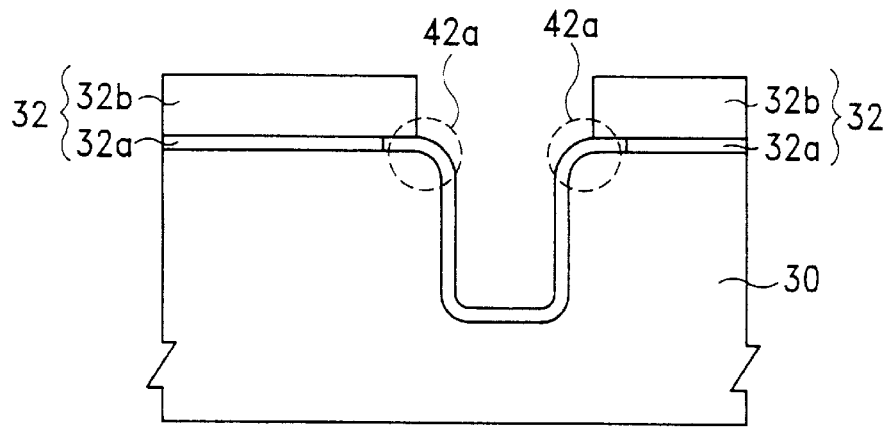
FIG. 6 illustrates a cross sectional view of forming a liner layer conformably over the trench in the present invention.

The oxide spacers 36 are then removed as shown in FIG. 5. A short dip in a clean step with a diluted hydrofluoric acid can do the work. A slightly undercut space 40 might be formed in the isotropic etching process of the hydrofluoric acid. Referring to FIG. 6, a liner layer 42 is conformably formed within the trench. Generally, the liner layer 42 can be a liner oxide layer. The liner oxide layer 42 is thermally grown from the semiconductor substrate 30 in an oxygen containing ambient with a high temperature of about 800° C. to 1100° C.

Referring to FIG. 5, with the removing of the oxide spacers 36, an open space for the up-growing of liner oxide near the convex edge 30a from the semiconductor substrate 30 is provided. In the conventional STI processes, the upgrowing of liner oxide near the convex edge 30a is greatly limited and suppressed by a masking layer or a nitride layer. Thus only a thin liner oxide layer is allowed to grow in the conventional STI processes. In the present embodiment, the growing of the liner oxide layer 42 is neither suppressed nor limited. Thus a much thicker liner oxide layer 42 with a well rounded corner 42a is grown as shown in FIG. 6. With the easier growth of the liner oxide layer 42, accompanying benefits like lower thermal load and shorter processing time can be achieved.

Figure 7:
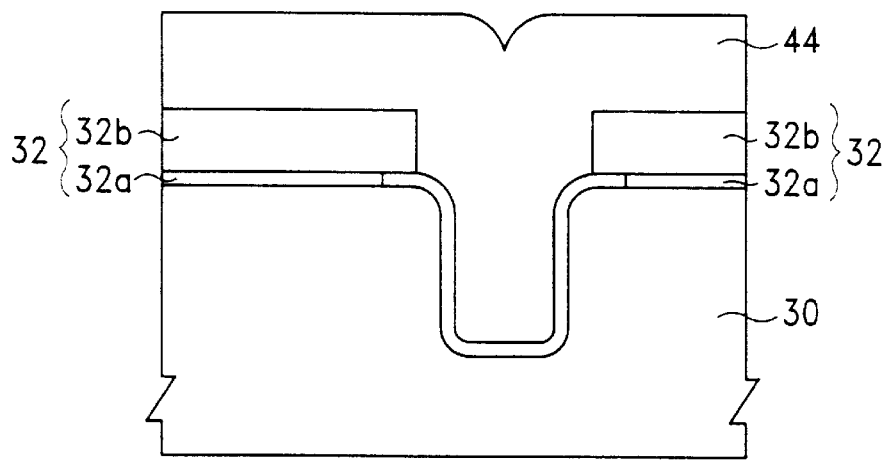
FIG. 7 illustrates a cross sectional view of forming a filling layer over the liner layer in the present invention.
Figure 8:
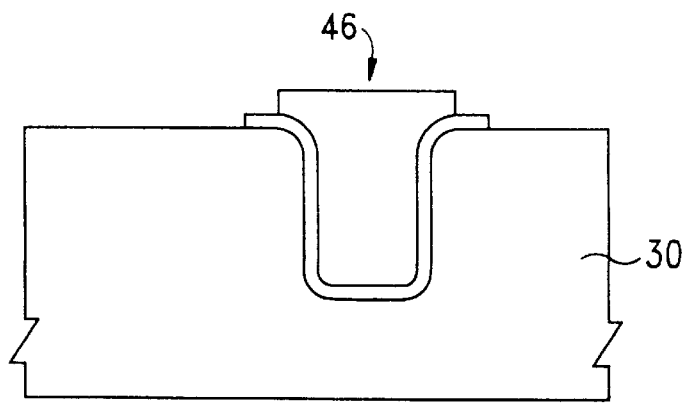
FIG. 8 illustrates a cross sectional view of removing the masking layer and a portion of the filling layer in the present invention.

In addition, two steps of forming filling material and removing the masking layer 32 can be performed. A filling layer 44 is formed over the liner oxide layer 42 within the trench 38, as shown in FIG. 7. A CVD oxide layer, or more specifically TEOS (tetraethyl-orthosilicate) oxide layer, can be employed as the filling layer 44. For some particular applications, a polysilicon layer or an epitaxial silicon layer can also be used as the filling layer 44. A serious steps are then performed to remove the masking layer 32 and a portion of the filling layer 44. The portion of the filling layer 44 which locates outside the trench structure is removed in the planarization processes. In general, one or more etching and CMP (chemical-mechanical polishing) steps are utilized. Thus a trench structure 46 is finished as shown in FIG. 8. The semiconductor substrate 30 with generally a great number of trench structures 46 is then processed with numerous steps to form active and passive devices.

The present invention provides a process of forming a STI (shallow trench isolation) for eliminating the kink effect. Oxide spacers 36 are formed after the formation of the opening 34. A thicker liner oxide layer 42 is formed especially at the corner region then the conventional STI processes. A larger process window for subthreshold kink free trench can be obtained. On the other hand, the width of the trench can be reduced by the oxide spacers and thus a T-shape trench can be obtained. Within the experimental results on testing the characteristics of the trench structure, a higher threshold voltage under the elimination of the kink effect is achieved. The operational characteristics of the device can be maintained without any degradation from the conventional STI processes.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming a trench isolation in a semiconductor substrate, said method comprising the steps of:

forming a masking layer over said semiconductor substrate;

removing a portion of said masking layer to form an opening to said semiconductor substrate;

forming oxide sidewall spacers on said opening;

removing a portion of said semiconductor substrate to form a trench, through an aperture defined by said oxide sidewall spacers;

removing said oxide sidewall spacers by wet etching; and forming a liner layer conformably over said trench.

2. The method of claim 1 and further comprising the steps of forming a filling layer over said liner layer within said trench, and over said masking layer; and removing said masking layer and a portion of said filling layer which locates outside said trench.

3. The method of claim 2, wherein said filling layer comprises a CVD (chemical vapor deposited) oxide layer.

4. The method of claim 1, wherein said masking layer comprises a pad oxide layer over said semiconductor layer; and a nitride layer over said pad oxide layer.

5. A method for forming a trench isolation in a semiconductor substrate, said method comprising the steps of:

forming a masking layer over said semiconductor substrate, said masking layer being defined with an aperture to said semiconductor substrate;

removing a portion of said semiconductor substrate to form a trench, through said aperture;

removing a portion of said masking layer around said aperture to provide an enlarged aperture; and forming a liner layer conformably over said trench.

6. The method of claim 1, wherein said oxide spacers are formed by depositing and etching back a CVD (chemical vapor deposited) oxide layer.

7. The method of claim 1, wherein said liner layer comprises a liner oxide layer which is thermally grown from said semiconductor substrate in an oxygen containing ambient.

8. A method for forming a trench isolation in a semiconductor substrate, said method comprising the steps of:

forming a masking layer over said semiconductor substrate, said masking layer comprises:

a pad layer over said semiconductor layer; and a stacked layer over said pad layer;

removing a portion of said masking layer to form an opening to said semiconductor substrate;

forming oxide sidewall spacers on said opening;

removing a portion of said semiconductor substrate to form a trench, through an aperture defined by said oxide sidewall spacers;

removing said oxide sidewall spacers by wet etching; and forming a liner layer conformably over said trench, said liner layer being grown from said semiconductor substrate.

9. The method of claim 8 and further comprising the steps of forming a filling layer over said liner layer within said trench, and over said masking layer; and removing said masking layer and a portion of said filling layer which locates outside said trench.

10. The method of claim 9, wherein said filling layer comprises a CVD (chemical vapor deposited) oxide layer.

11. The method of claim 8, wherein said pad layer comprises a pad oxide layer and said stacked layer comprises a nitride layer.

12. The method of claim 5, further comprising the steps of forming a filling layer over said liner layer within said trench, and over said masking layer; and removing said masking layer and a portion of said filling layer which is located outside said trench.

13. The method of claim 8, wherein said oxide spacers are formed by depositing and etching back a CVD (chemical vapor deposited) oxide film.

14. The method of claim 8, wherein said liner layer comprises a liner oxide layer which is thermally grown from said semiconductor substrate in an oxygen containing ambient.

15. A method for forming a trench isolation in a semiconductor substrate, said method comprising the steps of:

forming a masking layer over said semiconductor substrate, said masking layer being defined with an aperture to said semiconductor substrate, wherein said masking layer comprises a pad oxide layer over said semiconductor substrate and a nitride layer over said pad oxide layer;

removing a portion of said semiconductor substrate to form a trench, through said aperture;

removing a portion of said masking layer around said aperture for having an enlarged aperture; and forming a liner layer conformably over said trench.

16. The method of claim 15 and further comprising the steps of forming a filling layer over said liner layer within said trench, and over said masking layer; and removing said masking layer and a portion of said filling layer which locates outside said trench.

17. The method of claim 5, wherein said liner layer comprises a liner oxide layer which is thermally grown from said semiconductor substrate in an oxygen-containing ambient.

18. The method of claim 15, wherein said masking layer further comprises sidewall spacers formed within said pad oxide layer and said nitride layer around said aperture, and said step of removing a portion of said masking layer being performed with the removing of said sidewall spacers for having said enlarged aperture.

19. The method of claim 18, wherein said sidewall spacers are formed by depositing and etching back a CVD (chemical vapor deposited) oxide film.

20. The method of claim 15, wherein said liner layer comprises a liner oxide layer which is thermally grown from said semiconductor substrate in an oxygen containing ambient.

* * * * *